(12) United States Patent
Neber et al.

(10) Patent No.: US 9,093,587 B2
(45) Date of Patent: Jul. 28, 2015

(54) TWO-AXIS SOLAR TRACKER DESIGN FOR LOW COST DEPLOYMENT AND PROFILE FOR REDUCED LOADING MOMENTS

(71) Applicant: Santa Clara University, Santa Clara, CA (US)

(72) Inventors: Matthew Neber, Miami, FL (US); Hohyun Lee, Santa Clara, CA (US); Laughlin Barker, Santa Clara, CA (US); Criselle G. Olaes, Santa Clara, CA (US); Darcy Marumoto, Pearl City, HI (US); Joseph Valdez, Folsom, CA (US)

(73) Assignee: Santa Clara University, Santa Clara, CA (US)

( * ) Notice: Subject to any disclaimer, the term of this patent is extended or adjusted under 35 U.S.C. 154(b) by 19 days.

(21) Appl. No.: 13/861,977

(22) Filed: Apr. 12, 2013

(65) Prior Publication Data
US 2013/0276864 A1 Oct. 24, 2013

Related U.S. Application Data

(60) Provisional application No. 61/635,239, filed on Apr. 18, 2012.

(51) Int. Cl.
| | |
|---|---|
| *H01L 31/052* | (2014.01) |
| *F16H 21/54* | (2006.01) |
| *F24J 2/00* | (2014.01) |
| *F24J 2/54* | (2006.01) |
| *H01L 31/042* | (2014.01) |

(52) U.S. Cl.
CPC .............. *H01L 31/052* (2013.01); *F16H 21/54* (2013.01); *F24J 2/00* (2013.01); *F24J 2/5424* (2013.01); *H02S 20/00* (2013.01); *F24J 2002/5451* (2013.01); *F24J 2002/5479* (2013.01); *Y02B 10/12* (2013.01); *Y02E 10/47* (2013.01); *Y02E 10/50* (2013.01); *Y10T 74/1892* (2015.01)

(58) Field of Classification Search
CPC .......................... H01L 31/0522; H01L 31/052
USPC .............................................. 136/246; 74/102
See application file for complete search history.

(56) References Cited

U.S. PATENT DOCUMENTS

| | | | | | |
|---|---|---|---|---|---|
| 4,700,013 | A | * | 10/1987 | Soule | 136/248 |
| 6,080,927 | A | * | 6/2000 | Johnson | 136/248 |

(Continued)

FOREIGN PATENT DOCUMENTS

WO    WO 2011/053659    10/2010

*Primary Examiner* — Golam Mowla
(74) *Attorney, Agent, or Firm* — Lumen Patent Firm

(57) ABSTRACT

A motion controlled tracking mount is provided that includes a lateral rail perpendicular to a longitudinal rail, a first translation element slides on the lateral rail and a second translation element slides on the longitudinal rail and slides onto the lateral rail, a first rotatable connector attached to the first translation element and a second rotatable connector attached to the second translation element that rotate about axes perpendicular to the lateral and longitudinal rails, an apparatus mount with a distal region pivotably connected to the second rotatable connector, where the pivotable connection axis is parallel to a lateral dimension of the mount, and a linkage with a proximal end pivotable connected to the first rotatable connector and a distal end is pivotably connected to a proximal region of the mount, where an axis of the pivotable connection at the distal end is parallel to the lateral dimension of the mount.

7 Claims, 5 Drawing Sheets

(56) References Cited

U.S. PATENT DOCUMENTS

| | | |
|---|---|---|
| 7,884,279 B2 | 2/2011 | Dold |
| 7,910,870 B2 | 3/2011 | Chyou |
| 2006/0054162 A1 | 3/2006 | Romeo |
| 2007/0070531 A1* | 3/2007 | Lu .................................. 359/851 |
| 2010/0024861 A1 | 2/2010 | Saldaña |
| 2011/0073104 A1 | 3/2011 | Dopp et al. |
| 2012/0152309 A1* | 6/2012 | Miller et al. ................... 136/246 |
| 2012/0152311 A1* | 6/2012 | Miller et al. ................... 136/246 |

* cited by examiner

TWO-AXIS SOLAR TRACKER DESIGN FOR LOW COST DEPLOYMENT AND PROFILE FOR REDUCED LOADING MOMENTS

CROSS-REFERENCE TO RELATED APPLICATIONS

This application claims priority from U.S. Provisional Patent Application 61/635,239 filed Apr. 18, 2012, which is incorporated herein by reference.

FIELD OF THE INVENTION

The invention relates generally to motion controlled devices. More particularly, the invention relates to a tracking mount configured for mounting and moving mounting a tracking dish or photovoltaic panel.

BACKGROUND OF THE INVENTION

The solar tracker is a device that is essential for any concentrated solar power application, and also greatly improves performance of photovoltaic (PV) devices. One problem that can arise in connection with solar power is the destruction of solar power systems by severe weather. Wind forces are currently an issue with mounting a tracking dish or PV panel atop a pole driven into the ground. Conventional PV tracking systems cannot be regressed for self preservation without disassembly and storage. Another disadvantage of conventional trackers is that they must be mounted atop a tall structure to allow the tracking device to have sufficient ground clearance when tracking the sun at elevations relatively close to the horizon.

The most common two axis tracking systems currently in use have a single pole driven into the ground combined with a drive unit coupling the pole to the tracking unit. To install the pole an auger must be used, and this can only be installed in climates where the soils will support a heavy post set in with cement. Installation requires considerable work from a civil engineering standpoint because the pressure distribution for a pole in the earth is complex even for simple lateral and axial loads from wind. The single drive unit operates the azimuth and elevation by rotating about vertical and horizontal axes.

These drive units contain multiple sets of gears that must be designed to handle very large moments and loads, therefore making them heavy duty pieces of equipment. Also, they often are fitted with heavy counter balances.

What is needed is a motion controlled tracking mount for communication dishes and PV panels that is impervious to wind forces.

SUMMARY OF THE INVENTION

To address the needs in the art, a motion controlled tracking mount is provided that includes a lateral rail that is perpendicular to a longitudinal rail, a first translation element that is slidably connected to the lateral rail and a second translation element that is slidably connected to the longitudinal rail and is disposed to slidably move onto the lateral rail, a first rotatable connector that is fixedly attached to the first translation element and a second rotatable connector that is fixedly attached to the second translation element, where the first and second rotatable connectors rotate about axes that are orthogonal to the lateral rail and the longitudinal rail. The invention further includes an apparatus mount, where a distal region of the apparatus mount is pivotably connected to the second rotatable connector, where an axis of the pivotable connection at the distal end of the apparatus mount is parallel to a lateral dimension of the apparatus mount, and a linkage, where a proximal end of the linkage is pivotably connected to the first rotatable connector and a distal end of the linkage is pivotably connected to a proximal region of the apparatus mount, where an axis of the pivotable connection at the distal end of the linkage is parallel to the lateral dimension of the apparatus mount, where the first translation element and the second translation element are moved according to motion control motors and a computer control unit.

According to one aspect of the invention, the first translation element and the second translation element are translated according to motion control motors. In one aspect, the motion control motors are actuated according to a computer control unit.

In a further aspect of the invention, the apparatus mount includes attachment elements that can include solar dish attachment elements, solar panel attachment elements or satellite dish attachment elements.

In another aspect of the invention, the motion controlled tracking mount translates movement of the first and the second translation elements in a Cartesian coordinate system to movement of the apparatus mount in a spherical coordinate system.

In yet another aspect of the invention, a plurality of the motion controlled tracking mounts are arranged in an array on a grid pattern of the lateral rails and the longitudinal rails, wherein a single actuator moves the lateral rails and the longitudinal rails to move the array of tracking mounts in tandem.

In a further aspect of the invention, a plurality of the lateral rails are arranged on a single longitudinal rail, where the motion controlled tracking mounts are arranged in series along the longitudinal rail.

DETAILED DESCRIPTION

Figure 1:
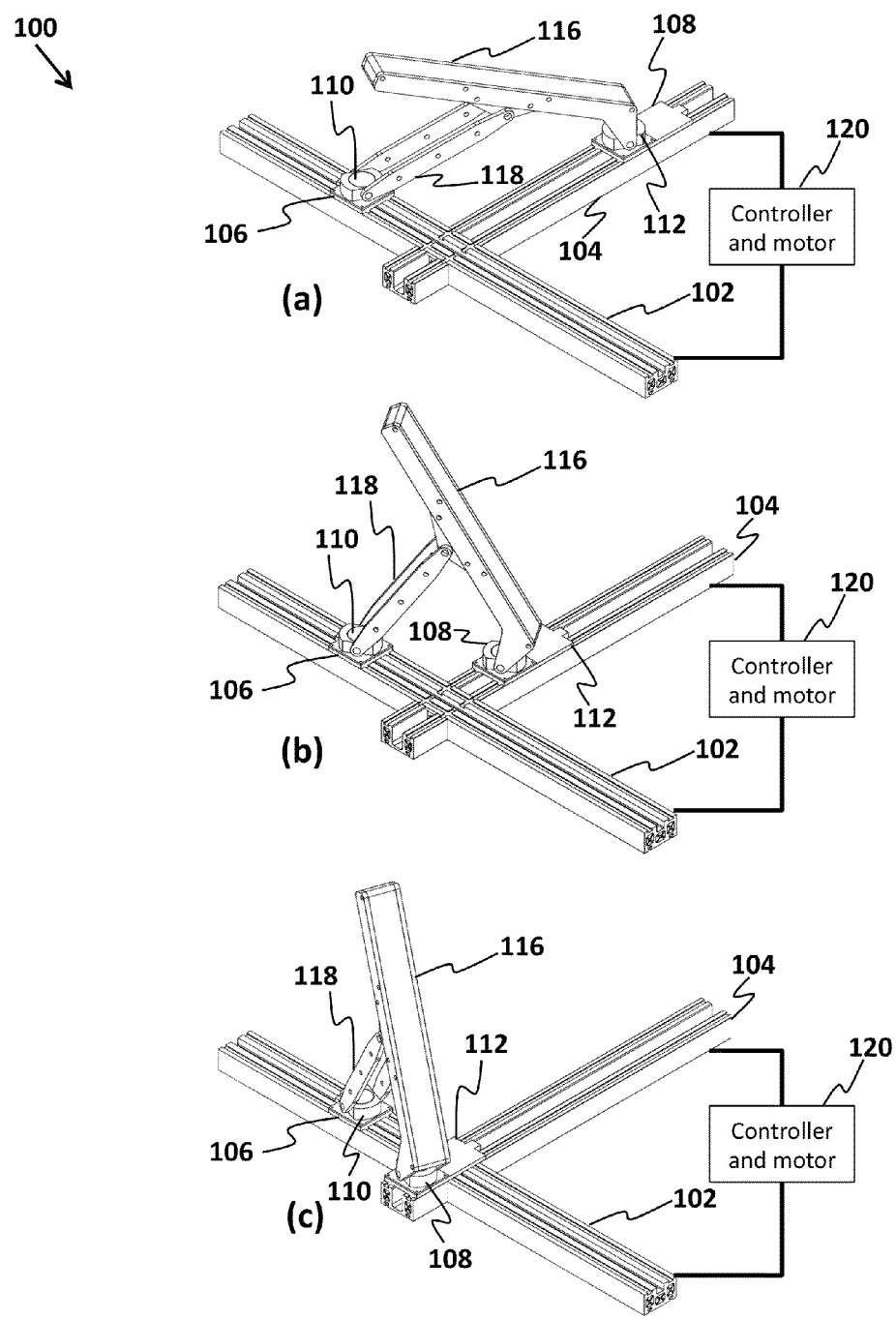
FIGS. 1a-1f show perspective and planar views of a motion controlled tracking mount in various solar tracking positions, according to one embodiment of the invention.
Figure 1:
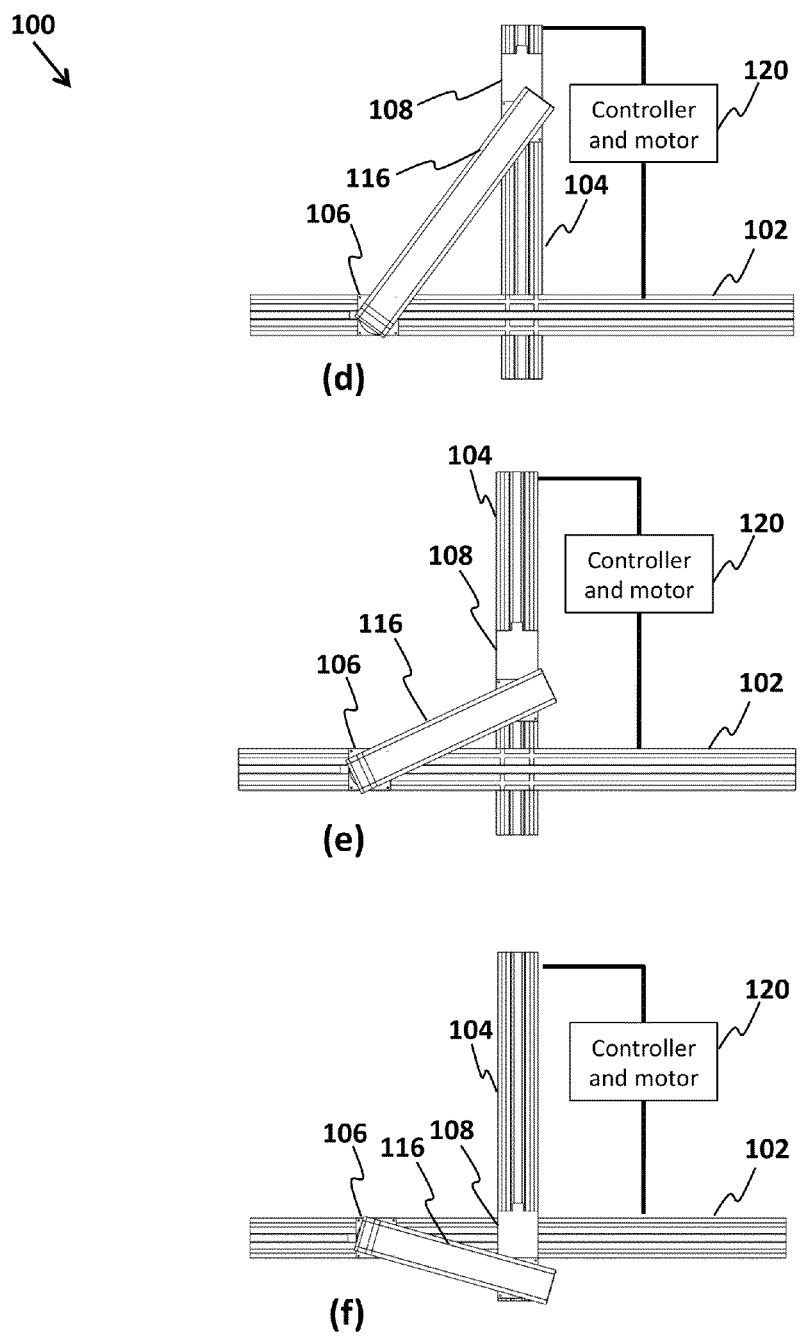

The present approach addresses the needs in the art by providing a motion controlled tracking mount that uses low-cost and parts, and a wide base that does not require an augered and cemented post for installation. Systems according to these principles can autonomously lay down flat to weather strong winds. For photovoltaic panels, the invention enables roof mount panels which track the sun without adding any risk to the roof itself in adverse weather conditions.

According to one embodiment, the invention provides a fixed base of the tracking device that is close to the ground for added stability and support, in a reduced cost and readily deployable package.

According to various embodiments, the invention is applicable for various devices that include concentrated solar power applications where a large and heavy dish concentrator must articulate to follow the sun's path throughout the sky. The invention is further applicable to photovoltaic panels, where the panel may be positioned in a flat, low profile orientation. Additionally, the invention is useful for communication satellite dishes.

In one embodiment, the system includes two perpendicular coplanar linear actuators. Together these two actuators control the azimuth and elevation of whatever device is mounted to the two moving pivot points.

The motion controlled tracking mount supports a device tracking the sun or satellite at two points for added structural stability over most other trackers, which typically attach at a single pivot point. In one embodiment, the invention employs a two-mount point scheme. The device requires only light anchoring into the ground due to its wide base, and efficiently deals with moment loading from the geometry of the design.

The design geometry is based on triangle manipulation, where two of the triangle's sides are fixed lengths. By manipulating the position of the two points where the fixed length sides intersect the base, the angle and orientation of the fixed length sides relative to the plane of the actuators is controlled. The angle between the plane and the fixed length legs is limited to normal, determined by the length ratio of the two fixed-length sides. The orientation of either fixed-length leg in the plane is unconstrained if the two points where the legs intersect the base of the triangle can be positioned at any point along the two principle axes. The described angle and orientation translates to the elevation and azimuth when one of the fixed-length sides is the tracking plane.

In order to orient the tracking plane to any azimuth and elevation in the hemisphere above the actuator plane would require that both translation elements be able to move their carriages equally in both directions from the intersection point. With modification of the length ratio the two fixed length sides, the tracker can cover the sun's path in any part of the world. Between the Tropic of Cancer and Tropic of Capricorn, the actuator paths must cross one another to capture the entire path of the sun.

Turning now to the figures, FIGS. 1a-1f show perspective and planar views of a motion controlled tracking mount in various solar tracking positions, according to one embodiment of the invention. Here, a motion controlled tracking mount 100 is provided that includes a lateral rail 102 that is perpendicular to a longitudinal rail 104, a first translation element 106 that is slidably connected to the lateral rail 102 and a second translation element 108 that is slidably connected to the longitudinal rail 104 and is disposed to slidably move onto the lateral rail 102, a first rotatable connector 110 that is fixedly attached to the first translation element 106 and a second rotatable connector 112 that is fixedly attached to the second translation element 108, where the first and second rotatable connectors 108/110 rotate about axes that are orthogonal to the lateral rail 102 and the longitudinal rail 104. The invention further includes an apparatus mount 116, where a distal region of the apparatus mount 116 is pivotably connected to the second rotatable connector 112, where an axis of the pivotable connection at the distal end of the apparatus mount 116 is parallel to a lateral dimension of the apparatus mount 116, and a linkage 118, where a proximal end of the linkage 118 is pivotably connected to the first rotatable connector 110 and a distal end of the linkage 118 is pivotably connected to a proximal region of the apparatus mount 116, where an axis of the pivotable connection at the distal end of the linkage 118 is parallel to the lateral dimension of the apparatus mount 116, where the first translation element 106 and the second translation element 108 are moved according to motion control motors and a computer controller 120. According to the invention, the motion controlled tracking mount 100 translates movement of the first and the second translation elements 106/108 in a Cartesian coordinate system to movement of the apparatus mount in a spherical coordinate system.

Figure 2:
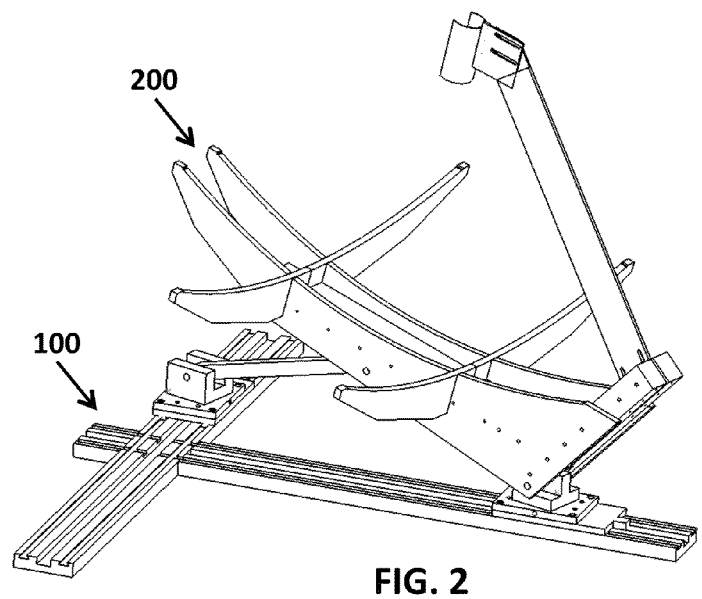
FIG. 2 shows a perspective view of concentrated solar dish or communication dish tracking unit, according to embodiments of the invention.
Figure 3:
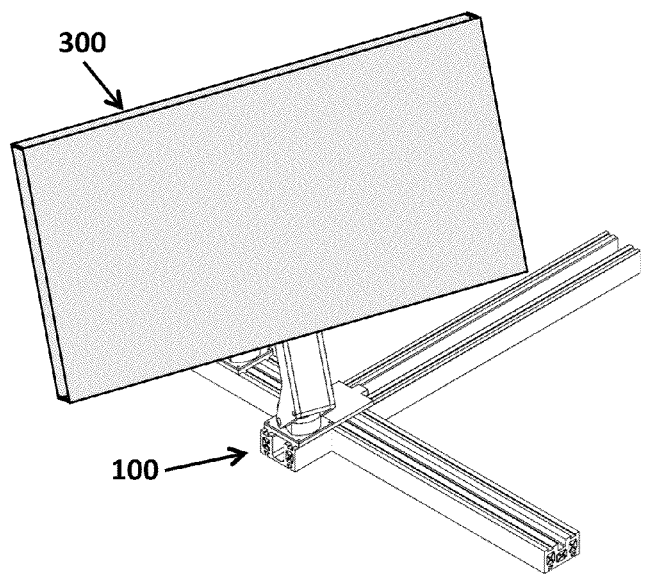
FIG. 3 shows a perspective view of a solar panel tracking unit, according to one embodiment of the invention.

In a further embodiment of the invention, the apparatus mount includes attachment elements that can include solar dish attachment elements, solar panel attachment elements or satellite dish attachment elements. FIG. 2 shows a perspective view of the motion controlled tracking mount 100 configured with a concentrated solar dish mount 200 (or communication dish) tracking unit, according to embodiments of the invention. FIG. 3 shows a perspective view of the motion controlled tracking mount 100 configured to hold a solar panel 300, according to embodiment of the invention. By extending the second translation element 108 attached to the apparatus mount 116 to its full length, the solar collector 300 will lay down flat. This proves extremely useful for a solar panel array because of the ability to lay flat in adverse weather conditions, and the possibility to be applied to a roof mounting system for home power generation (see FIG. 6).

Figure 5:
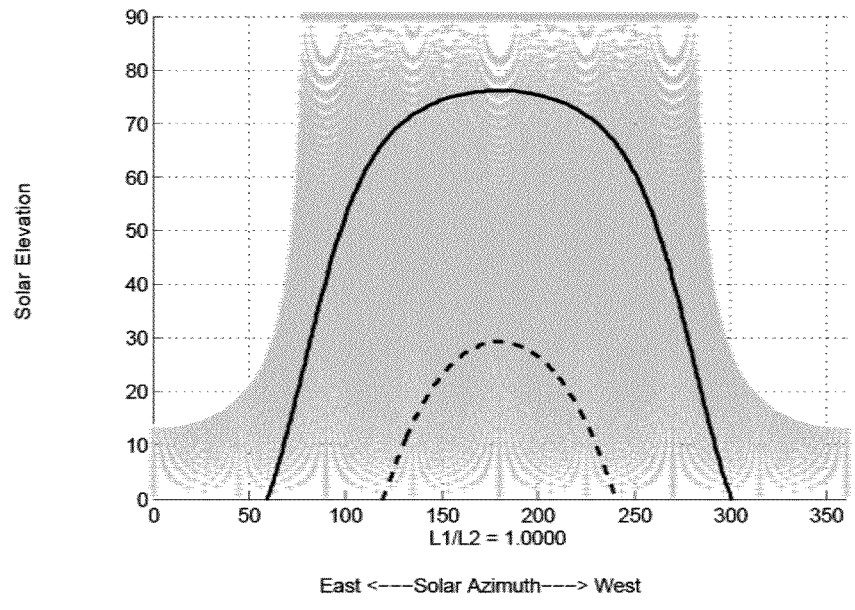
FIG. 5 shows a concentrated solar dish tracking a daily solar trajectory under guidance by a controller and motors, according to one embodiment of the invention.
Figure 4:
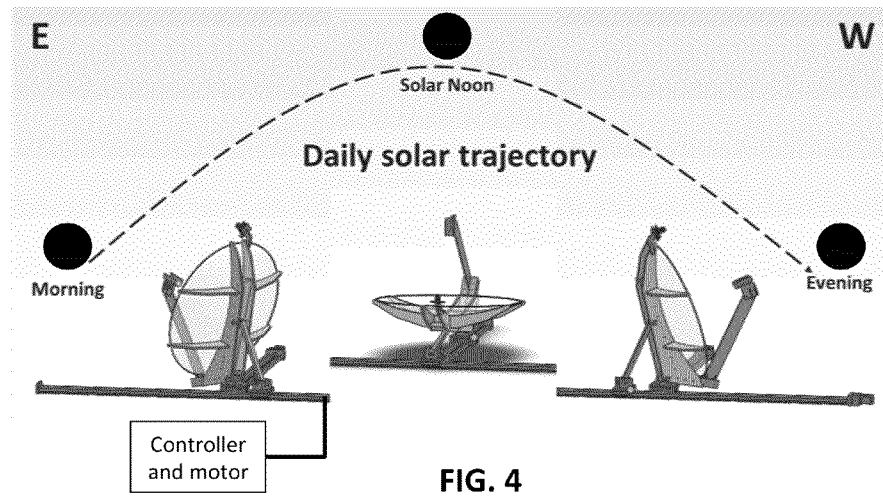
FIG. 4 shows the coverage area of a solar tracker, where the shaded area represents all possible combinations of elevation and azimuths for a particular geometry, the solid line and dashed line represent sun's path at summer and winter solstices, respectively, according to one embodiment of the invention.

FIG. 4 shows a graph of the sun's path at Santa Clara University—latitude 37.3414—at summer and winter solstices. They are the highest and lowest path the sun takes for that location in a year. All other paths lie in between these two lines. The shaded area is the tracker coverage area. Although the details of FIG. 4 will depend on location, the general shape of the curves will be similar, and sufficient coverage can be obtained with the motion controlled tracking mount holding a concentrated solar dish, as shown in FIG. 5, at any location.

Figure 6:
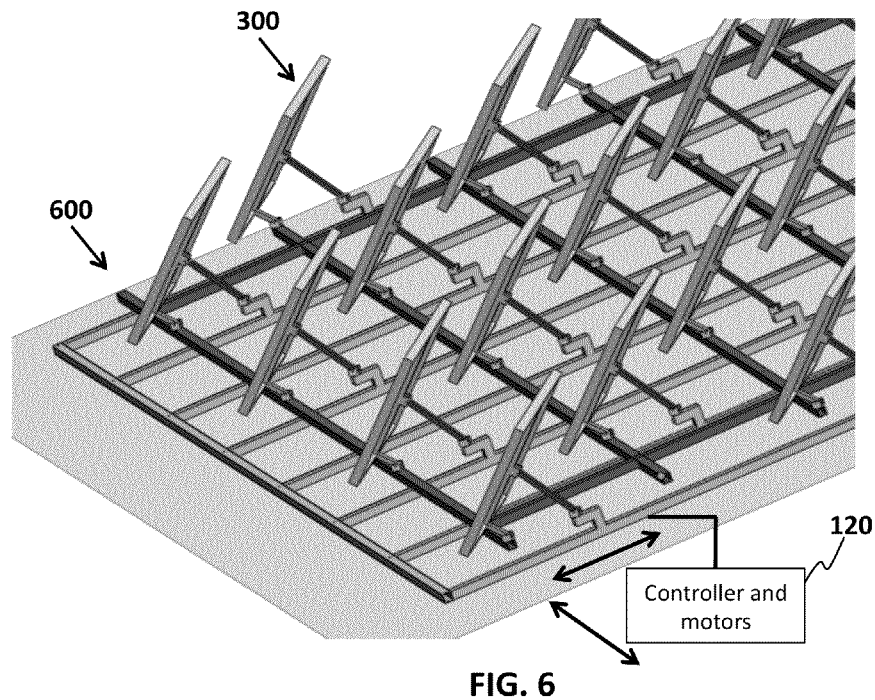
FIG. 6 shows a schematic of an array of solar panels on a unified grid that can be applied to a roof mount photovoltaic system, according to one embodiment of the invention.

In yet another aspect of the invention, a plurality of the motion controlled tracking mounts are arranged in an array on a grid pattern of the lateral rails and the longitudinal rails, wherein a single actuator moves the lateral rails and the longitudinal rails to move the array of tracking mounts in tandem. As shown in FIG. 6, multiple panels 300 are mounted on a single unified grid system 600 to be driven with a single pair of controller/motors 120. Here, the arrays 600 are considered a single modular deployable unit driven by only one central location. This embodiment provides deployment cost savings by reducing the total number of components and reducing power requirements to drive the system by removing redundancies. The scale of this variation can be as large as megawatt size photovoltaic arrays for utility scale power production. FIG. 6 shows this embodiment applied to a roof mount photovoltaic system. The total number of required panels 300 are decreased by incorporating an arrayed grid tracking system 600, according to one embodiment of the current invention. The panels 300 are also spaced so that they shade other panels as little as possible during early and late hours.

Figure 7:
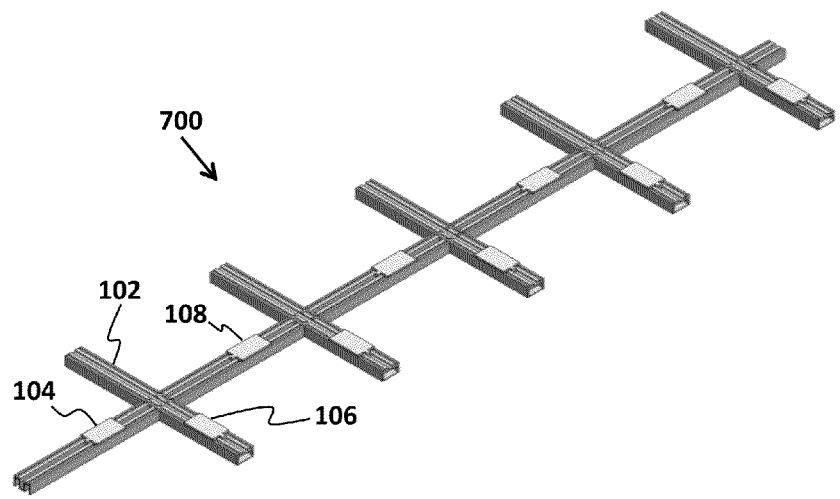
FIG. 7 shows the motion controlled tracking mount with a plurality of lateral rails arranged on a single longitudinal rail, where the motion controlled tracking mounts are arranged in series along the longitudinal rail, according to one embodiment of the invention.

FIG. 7 shows a motion controlled tracking mount series array 700, according to a further embodiment of the invention, where a plurality of the lateral rails 102 are arranged on a single longitudinal rail 104, where the motion controlled tracking mounts (not shown for clarity) are arranged in series on a series of second translation elements 108 along the longitudinal rail 104, where each of the lateral rails 102 is disposed with a first translation element 106.

Various applications are possible. For concentrated solar power applications this system can be used on large-scale commercial and residential units as well as small scale (lab scale) units. Large-scale units include dish collectors up to 100 square meters in collector area and are used primarily for renewable power generation. Small scale (lab scale) units are solar collectors that can be easily stored in a room and transported to test sites. For photovoltaic applications the system offers the possibility to roof mount solar panels, which may track the sun. The system also provides more support to a photovoltaic module than any currently produced system and offers the ability to retract to a low profile flat position for adverse weather conditions.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. All such variations are considered to be within the scope and spirit of the present invention as defined by the following claims and their legal equivalents.

What is claimed:

1. A motion controlled tracking mount, comprising:
   a. a lateral rail and a longitudinal rail, wherein said lateral rail is orthogonal to said longitudinal rail;
   b. a first translation element and a second translation element, wherein said first translation element is slidably connected to said lateral rail, wherein said second translation element is slidably connected to said longitudinal rail, wherein said second translation element is disposed to slidably move onto said lateral rail;
   c. a first rotatable connector and a second rotatable connector, wherein said first rotatable connector is fixedly attached to said first translation element, wherein said second rotatable connector is fixedly attached to said second translation element, wherein said first rotatable connector and said second rotatable connector rotate about axes that are perpendicular to said lateral rail and said longitudinal rail;
   d. an apparatus mount, wherein a distal region of said apparatus mount is pivotably connected to said second rotatable connector, wherein an axis of said pivotable connection at said distal end of said apparatus mount is parallel to a lateral dimension of said apparatus mount; and
   e. a linkage, wherein a proximal end of said linkage is pivotably connected to said first rotatable connector, wherein a distal end of said linkage is pivotably connected to a proximal region of said apparatus mount, wherein an axis of said pivotable connection at said distal end of said linkage is parallel to said lateral dimension of said apparatus mount, wherein said first translation element and said second translation element are moved according to motion control motors and a computer control unit.

2. The motion controlled tracking mount of claim 1, wherein said first translation element and said second translation element are translated according to motion control motors.

3. The motion controlled tracking mount of claim 2, wherein said motion control motors are actuated according to a computer control unit.

4. The motion controlled tracking mount of claim 1, wherein said apparatus mount comprises attachment elements, wherein said attachment elements are selected from the group consisting of solar dish attachment elements, solar panel attachment elements and satellite dish attachment elements.

5. The motion controlled tracking mount of claim 1, wherein said motion controlled tracking mount translates movement of said first and said second translation elements in a Cartesian coordinate system to movement of said apparatus mount in a spherical coordinate system.

6. The motion controlled tracking mount of claim 1, wherein a plurality of said motion controlled tracking mounts are arranged in an array on a grid pattern of said lateral rails and said longitudinal rails, wherein a single actuator moves said lateral rails and said longitudinal rails to move said array of tracking mounts in tandem.

7. The motion controlled tracking mount of claim 1, wherein a plurality of said lateral rails are arranged on a single longitudinal rail, wherein said motion controlled tracking mounts are arranged in series along said longitudinal rail.

\* \* \* \* \*